(12) United States Patent
Cohen

(10) Patent No.: US 6,963,505 B2
(45) Date of Patent: Nov. 8, 2005

(54) METHOD CIRCUIT AND SYSTEM FOR DETERMINING A REFERENCE VOLTAGE

(75) Inventor: Guy Cohen, Yaad (IL)

(73) Assignee: Aifun Semiconductors Ltd., Nentanya (IL)

(*) Notice: Subject to any disclaimer, the term of this patent is extended or adjusted under 35 U.S.C. 154(b) by 0 days.

(21) Appl. No.: 10/695,448

(22) Filed: Oct. 29, 2003

(65) Prior Publication Data

US 2004/0136220 A1 Jul. 15, 2004

Related U.S. Application Data

(60) Provisional application No. 60/421,785, filed on Oct. 29, 2002.

(51) Int. Cl.[7] .................................................. G11C 16/06
(52) U.S. Cl. .............................. 365/185.2; 365/185.03; 365/210
(58) Field of Search ........................ 365/185.03, 185.2, 365/201, 210

(56) References Cited

U.S. PATENT DOCUMENTS

| | | |
|---|---|---|
| 4,342,102 A | 7/1982 | Puar |
| 4,388,705 A | 6/1983 | Sheppard |
| 4,389,705 A | 6/1983 | Sheppard |
| 4,527,257 A | 7/1985 | Cricchi |
| 4,667,217 A | 5/1987 | Janning |
| 5,027,321 A | 6/1991 | Park |
| 5,142,496 A | 8/1992 | Van Buskirk |
| 5,172,338 A | 12/1992 | Mehrotra et al. |
| 5,241,497 A | 8/1993 | Komarek |
| 5,276,646 A | 1/1994 | Kim et al. |
| 5,289,412 A | 2/1994 | Frary et al. |
| 5,295,108 A | 3/1994 | Higa |
| 5,305,262 A | 4/1994 | Yoneda |
| 5,335,198 A | 8/1994 | Van Buskirk et al. |
| 5,345,425 A | 9/1994 | Shikatani |
| 5,349,221 A | 9/1994 | Shimoji |
| 5,359,554 A | 10/1994 | Odake et al. |
| 5,361,343 A | 11/1994 | Kosonocky et al. |
| 5,381,374 A | 1/1995 | Shiraishi et al. |
| 5,418,743 A | 5/1995 | Tomioka et al. |
| 5,434,825 A | 7/1995 | Harari |
| 5,450,341 A | 9/1995 | Sawada et al. |
| 5,450,354 A | 9/1995 | Sawada et al. |
| 5,477,499 A | 12/1995 | Van Buskirk et al. |
| 5,508,968 A | 4/1996 | Collins et al. |
| 5,521,870 A | 5/1996 | Ishikawa |

(Continued)

FOREIGN PATENT DOCUMENTS

| | | |
|---|---|---|
| EP | 0740307 | 10/1996 |
| EP | 1 071 096 | 1/2001 |

(Continued)

*Primary Examiner*—Son Mai
(74) *Attorney, Agent, or Firm*—Eitan Law Group

(57) ABSTRACT

The present invention is a method, circuit and system for determining a reference voltage. Some embodiments of the present invention relate to a system, method and circuit for establishing a set of operating reference cells to be used in operating (e.g. reading) cells in an NVM block or array. As part of the present invention, at least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating (e.g. reading) other cells, outside the subset of cells, in the NVM block or array. In a further embodiment, the selected set of test reference cells may be used to establish an operating set of reference cells having reference voltages substantially equal to those of the selected test set.

35 Claims, 5 Drawing Sheets

U.S. PATENT DOCUMENTS

| | | | |
|---|---|---|---|
| 5,537,358 A | | 7/1996 | Fong |
| 5,544,116 A | | 8/1996 | Chao et al. |
| 5,568,085 A | | 10/1996 | Eitan et al. |
| 5,583,808 A | | 12/1996 | Brahmbhatt |
| 5,627,790 A | | 5/1997 | Golla et al. |
| 5,633,603 A | | 5/1997 | Lee |
| 5,657,332 A | * | 8/1997 | Auclair et al. ............... 714/763 |
| 5,694,356 A | | 12/1997 | Wong et al. |
| 5,712,815 A | | 1/1998 | Bill et al. |
| 5,717,632 A | | 2/1998 | Richart et al. |
| 5,748,534 A | | 5/1998 | Dunlap et al. |
| 5,754,475 A | | 5/1998 | Bill et al. |
| 5,768,193 A | | 6/1998 | Lee et al. |
| 5,771,197 A | | 6/1998 | Kim |
| 5,784,314 A | | 7/1998 | Sali et al. |
| 5,805,500 A | * | 9/1998 | Campardo et al. ........ 365/185.2 |
| 5,812,449 A | | 9/1998 | Song |
| 5,812,456 A | | 9/1998 | Hull et al. |
| 5,822,256 A | | 10/1998 | Bauer et al. |
| 5,828,601 A | * | 10/1998 | Hollmer et al. .......... 365/185.2 |
| 5,841,700 A | | 11/1998 | Chang |
| 5,847,441 A | | 12/1998 | Cutter et al. |
| 5,867,429 A | | 2/1999 | Chen et al. |
| 5,886,927 A | | 3/1999 | Takeuchi |
| 5,936,888 A | | 8/1999 | Sugawara |
| 5,940,332 A | | 8/1999 | Artieri |
| 5,946,258 A | | 8/1999 | Evertt et al. |
| 5,949,728 A | | 9/1999 | Liu et al. |
| 5,969,993 A | | 10/1999 | Takeshima |
| 5,982,666 A | | 11/1999 | Campardo |
| 5,986,940 A | | 11/1999 | Atsumi et al. |
| 6,011,725 A | | 1/2000 | Eitan |
| 6,034,896 A | | 3/2000 | Ranaweera et al. |
| 6,044,019 A | * | 3/2000 | Cernea et al. ........... 365/185.2 |
| 6,044,022 A | | 3/2000 | Nachumovsky |
| 6,084,794 A | | 7/2000 | Lu et al. |
| 6,108,240 A | | 8/2000 | Lavi et al. |
| 6,118,692 A | | 9/2000 | Banks |
| 6,128,226 A | | 10/2000 | Eitan et al. |
| 6,134,156 A | | 10/2000 | Eitan |
| 6,147,904 A | | 11/2000 | Liron |
| 6,169,691 B1 | | 1/2001 | Pasotti et al. |
| 6,185,143 B1 | | 2/2001 | Perner et al. |
| 6,201,737 B1 | | 3/2001 | Hollmer et al. |
| 6,205,056 B1 | | 3/2001 | Pan et al. |
| 6,222,762 B1 | | 4/2001 | Guterman et al. |
| 6,233,180 B1 | | 5/2001 | Eitan et al. |
| 6,240,040 B1 | | 5/2001 | Akaogi et al. |
| 6,252,799 B1 | | 6/2001 | Liu et al. |
| 6,282,133 B1 | | 8/2001 | Nakagawa et al. |
| 6,285,589 B1 | | 9/2001 | Kajitani |
| 6,307,807 B1 | | 10/2001 | Sakui et al. |
| 6,331,950 B1 | | 12/2001 | Kuo et al. |
| 6,351,415 B1 | | 2/2002 | Kushnarenko |
| 6,353,554 B1 | | 3/2002 | Banks |
| 6,469,929 B1 | | 10/2002 | Kushnarenko et al. |
| 6,469,935 B2 | | 10/2002 | Hayashi |
| 6,496,414 B2 | | 12/2002 | Kasa et al. |
| 6,510,082 B1 | | 1/2003 | Le et al. |
| 6,522,585 B2 | | 2/2003 | Pasternak |
| 6,525,969 B1 | | 2/2003 | Kurihara et al. |
| 6,529,412 B1 | | 3/2003 | Chen et al. |
| 6,535,434 B2 | | 3/2003 | Maayan et al. |
| 6,552,387 B1 | | 4/2003 | Eitan |
| 6,574,139 B2 | | 6/2003 | Kurihara |
| 6,594,181 B1 | | 7/2003 | Yamada |
| 6,636,440 B2 | | 10/2003 | Maayan et al. |
| 6,639,837 B2 | * | 10/2003 | Takano et al. ........... 365/185.2 |
| 6,639,844 B1 | | 10/2003 | Liu et al. |
| 6,643,170 B2 | | 11/2003 | Huang et al. |
| 6,643,178 B2 | | 11/2003 | Kurihara |
| 6,650,568 B2 | | 11/2003 | Iijima |
| 6,670,669 B1 | | 12/2003 | Kawamura |
| 2001/0006477 A1 | | 7/2001 | Banks |
| 2002/0004878 A1 | | 1/2002 | Norman |
| 2002/0034097 A1 | | 3/2002 | Banks |
| 2002/0071313 A1 | | 6/2002 | Takano et al. |
| 2002/0132436 A1 | | 9/2002 | Eliyahu et al. |
| 2002/0191465 A1 | | 12/2002 | Maayan et al. |
| 2003/0117841 A1 | | 6/2003 | Yamashita |
| 2003/0117861 A1 | | 6/2003 | Maayan et al. |
| 2003/0142544 A1 | | 7/2003 | Maayan et al. |
| 2003/0208663 A1 | | 11/2003 | Van Buskirk et al. |
| 2003/0214844 A1 | | 11/2003 | Iijima |
| 2004/0008541 A1 | | 1/2004 | Maayan et al. |
| 2004/0012993 A1 | | 1/2004 | Kurihara |
| 2004/0013000 A1 | | 1/2004 | Torii |

FOREIGN PATENT DOCUMENTS

| | | |
|---|---|---|
| EP | 1126468 | 8/2001 |
| EP | 1164597 | 12/2001 |
| EP | 0 656 628 | 4/2003 |
| JP | 408106791 | 4/1996 |
| JP | 020022164 BB | 8/2002 |
| WO | WO 00/46808 | 8/2000 |
| WO | WO 03/036651 | 5/2003 |
| WO | WO 03/063168 | 7/2003 |
| WO | WO 03/088261 | 10/2003 |

* cited by examiner

METHOD CIRCUIT AND SYSTEM FOR DETERMINING A REFERENCE VOLTAGE

CROSS-REFERENCE TO RELATED APPLICATIONS

The present application claims priority from U.S. provisional patent application Ser. No. 60/421,785, filed Oct. 29, 2002, which is hereby incorporated by reference in its entirety.

FIELD OF THE INVENTION

The present invention generally relates to the field of non-volatile memory ("NVM") cells. More specifically, the present invention relates to a method and a system for selecting a reference voltage of one or more reference cells in order to read one or more memory cells within a memory cell array.

BACKGROUND OF THE INVENTION

NVM cells are generally operated (e.g. programmed, read, and erased) using one or more reference structures or cells. Each of the one or more reference structures or cells may be compared against a memory cell being operated in order to determine a condition or state of the memory cell being operated. As is well known, an NVM cell's state may be defined and determined by its threshold voltage, the voltage at which the cell begins to conduct current. An NVM cell's threshold voltage level is usually correlated to the amount of charge stored in a charge storage region of the cell. Different threshold voltage ranges are associated with different states of an NVM cell. FIG. 1A, shows a graph depicting the boundaries between the two states, erased and programmed, of a binary NVM cell, and the buffer region in between the two states.

Generally, in order to determine whether an NVM cell is in a specific state, for example erased, programmed, or programmed at one of multiple possible programmed states within a Multi-Level Cell ("MLC"), the cell's threshold level is compared to that of a reference structure or cell whose threshold level is set, or otherwise known to be, at a voltage level associated with the specific state being tested for. Comparing the threshold voltage of an NVM cell to that of a reference cell is often accomplished using a sense amplifier or similar circuit. Various techniques for comparing an NVM's threshold voltage against those of one or more reference cells or structures, in order to determine the NVM's cells state, are well known and applicable to the present invention. Any method or circuit presently known or to be devised in the future for comparing threshold voltage levels of reference cells or structures against NVM cells are applicable to the present invention.

When programming an NVM cell to a desired state, after each programming pulse, an NVM cell's threshold value may be compared against a reference cell having a reference threshold value set at a voltage level defined as the "program verify" level. The reference cell with a threshold voltage set at a voltage level defined as a "program verify" level for the given state may be compared to the threshold voltage of the cell being programmed (i.e. charged) in order to determine whether a charge storage area or region of the cell being programmed has been sufficiently charged so as to have placed the cell in a condition which may be considered "programmed" at the desired state.

When reading an NVM cell, to determine whether it is at a particular state, the cell's threshold voltage may be compared against that of a reference cell having a reference threshold voltage defined as a "read" level for the specific state. A "read" level is usually set lower than a "program verify" level and higher than the erase verify level in order to compensate for voltage drifts which may occur during operation. A logical state of the cell is defined as '0' if the cell's Vt is higher than that of the read reference and '1' if it is lower.

In an MLC, two or more programming levels may co-exist on the same cell, as is drawn in FIG. 1B. In the case where an MLC cell is being read to determine at which one of the multiple logical states the cell resides, at least two read reference cells must be used. During read operation, it must be determined that the MLC cell's threshold is in one of three or more regions bounded by the two or more threshold voltages defined by read reference cells. As is depicted in FIG. 1B. The voltage threshold boundaries which define a given state in an MLC are usually considerably smaller than those for a binary NVM cell. FIG. 1B, to which reference is now made, illustrates four different threshold voltage regions of an MLC, where each region is associated with either one of the programmed states of the MLC or with the erased state of the MLC. Because in an MLC a rather fixed range of potential threshold voltages (e.g. 3 Volts to 9 Volts) needs to be split into several sub-ranges or regions, the size of each sub-range or region in an MLC is usually smaller than a region of a binary NVM cell, which binary cell only requires two voltage threshold regions, as seen in FIG. 1A.

The voltage threshold of an NVM cell seldom stays fixed. Threshold voltage drift is a phenomenon which may result in large variations of the threshold voltage of a memory cell. These variations may occur due to charge leakage from the cell's charge storage region, temperature changes, and due to interference from the operation of neighboring NVM cells. FIG. 2, to which reference is now made, shows a graph depicting threshold voltages ($V_t$) changes associated with two program states of an exemplary MLC due to drift, as a function of time, for 10 cycles and for 1000 cycles. As seen in the graph, voltage drift may occur across numerous cells, and may occur in a correlated pattern across these cells. It is also known that the magnitude and directions of the drifts depends upon the number of times the NVM went through program and erase cycles and on the level of programming of an MLC. It is also known that deviations in cells ($V_t$) may be either in the upward or downward directions.

Variation of the threshold voltage of memory cells may lead to false reads of the state and may further result in the corruption of the data in the memory array. Voltage drift is especially problematic in MLC cells where the $V_t$ regions or sub-ranges associated with each programmed state are relatively smaller than those for a typical binary cell.

In order to reduce data loss and data corruption due to drift in the threshold voltages of the cells of an NVM array, threshold voltage drift of cells in the NVM array should be compensated for. For a given NVM array, it would be desired to provide one or a set of reference cells whose references threshold voltages are offset from defined verify threshold levels by some value related to the actual voltage drift experienced by the NVM cells to be read. There is a well understood need for an efficient and reliable method of determining a set of reference voltage levels which may accommodate variations in the threshold voltages of cells of an NVM array, and of established reference cells with the determined reference voltages.

SUMMARY OF THE INVENTION

The present invention is a method, circuit and system for determining a reference voltage. Some embodiments of the present invention relate to a system, method and circuit for establishing a set of operating reference cells to be used in operating (e.g. reading) cells in an NVM block or array. As part of the present invention, at least a subset of cells of the NVM block or array may be read using each of two or more sets of test reference cells, where each set of test reference cells may generate or otherwise provide reference voltages at least slightly offset from each other set of test reference cells. For each set of test reference cells used to read the at least a subset of the NVM block, a read error rate may be calculated or otherwise determined. A set of test reference cells associated with a relatively low read error rate may be selected as the set of operating reference cells to be used in operating (e.g. reading) other cells, outside the subset of cells, in the NVM block or array. In a further embodiment, the selected set of test reference cells may be used to establish an operating set of reference cells having reference voltages substantially equal to those of the selected test set.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non limiting detailed description when read with the accompanied drawings in which:

Figure 1A:
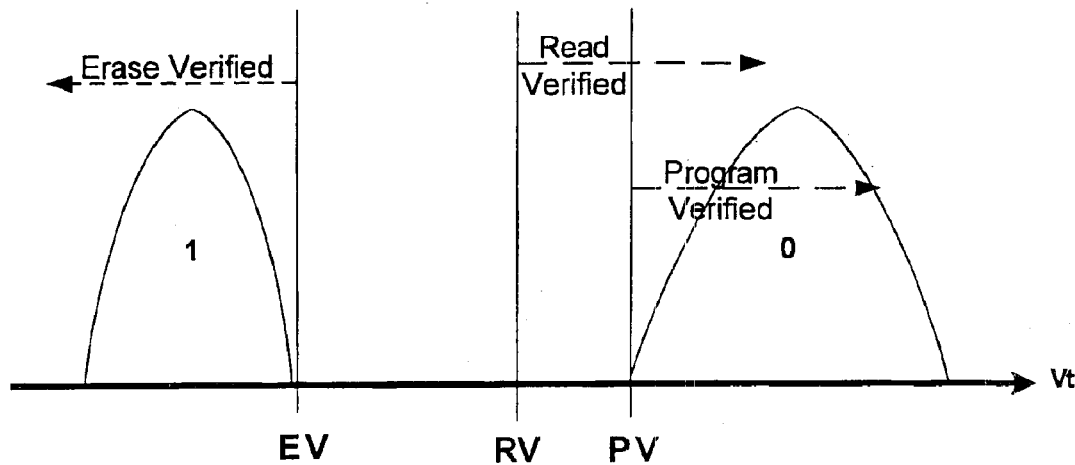
FIG. 1A, is a graphical illustration of the different threshold voltages associated with the different states of a binary NVM cell, where both the Program Verify and Read Verify Threshold Levels are visible.
Figure 1B:
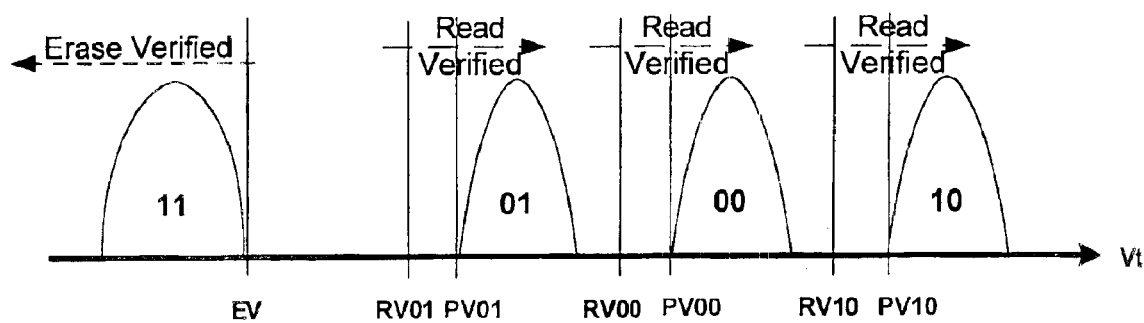
FIG. 1B, is a graphical illustration of different threshold voltages, each being associated with the boundary of a different program state of a Multi-Level Cell (MLC)
Figure 2:
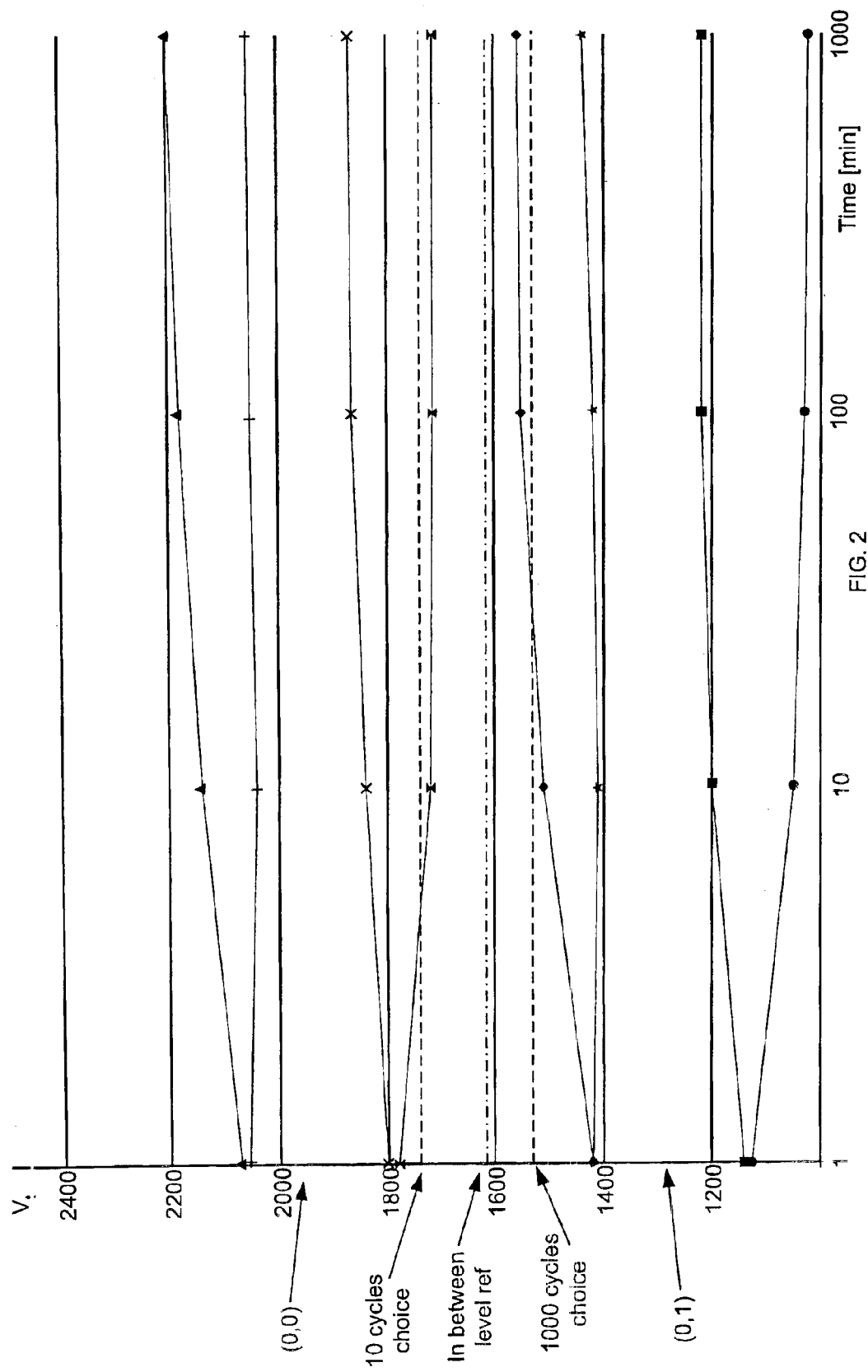
FIG. 2 is a graph illustrating measured changes in the threshold voltages ($V_t$) associated with each program state of an exemplary Multi Level Cell (MLC) due to $V_t$ drift, as a function of time, for 10 cycles and for 1000 cycles.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods and procedures have not been described in detail so as not to obscure the present invention.

The present invention is a method, circuit and system for determining a reference voltage. Some embodiments of the present invention relate to a system, method and circuit for establishing a set of operating reference cells to be used in operating (e.g. reading) cells in an NVM block or array. As part of the present invention, at least a subset of cells of the NVM block or array may be read using each of two or more sets of test reference cells, where each set of test reference cells may generate or otherwise provide reference voltages at least slightly offset from each other set of test reference cells. For each set of test reference cells used to read at least a subset of the NVM block, a read error rate may be calculated or otherwise determined. A set of test reference cells associated with a relatively low read error rate may be selected as the set of operating reference cells to be used in operating (e.g. reading) other cells, outside the subset of cells, in the NVM block or array. In a further embodiment, the selected set of test reference cells may be used to establish (e.g. program) an operating set of reference cells having reference voltages substantially equal to those of the selected test set.

Figure 3:
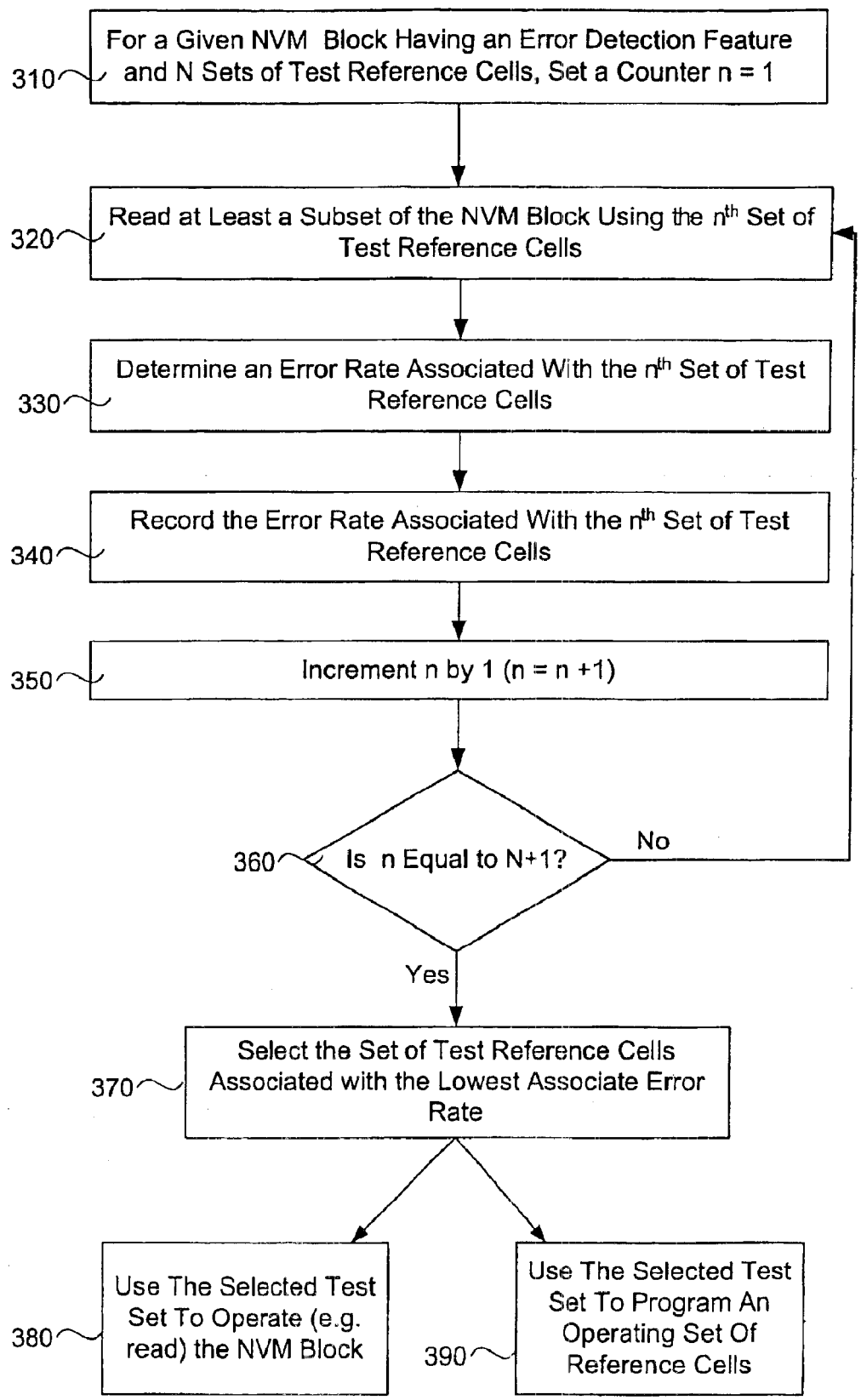
FIG. 3 is a flow chart illustration of a method of selecting a set of reference cells to be used in operating an NVM block or array, in accordance with some embodiments of the present invention.

Reference is now made to FIG. 3, which is a flow chart illustration of the steps of a method of selecting a set of reference cells to be used in operating an NVM block or array, in accordance with some embodiments of the present invention. As part of some embodiments of the present invention, for a given NVM block or array having an associated error detection feature and being associated with N sets of test reference cells, a set counter 'n' may initially be set to 1 (block 310). Next, the $n^{th}$ set of test reference cells, initially the $1^{st}$ set, may be used to read at least a subset of the NVM block (block 320).

The data read at block 320 may be used to determine a read error rate associated with the $n^{th}$ set of test reference cells (block 330). According to some embodiments of the present invention, the at least a subset of the NVM block may be a predefined portion or segment of the NVM block where source data is stored on the NVM cells along with extra error detection data/codes derived during programming. The read error rate may be determined using a variety of error rate sampling and/or error detection techniques, for example, parity bit, checksum, CRC and various other techniques. Any error detection coding and/or evaluation technique, presently known or to be devised in the future, may be applicable to present invention.

Once an error rate is calculated or otherwise determined for the at least a subset of the NVM block using the $n^{th}$ set of test reference cells, the error rate associated with the $n^{th}$ set of test reference cells may be recorded (block 340). The counter 'n' may then be incremented by 1 (block 350), and the counter may be checked to see whether the new 'n' is equal to N+1, a value greater than the total number of test reference cell sets (block 360). In case that the new 'n' is smaller (not equal) than N+1 blocks 320–360 may be repeated, and thus an error rate associated with the use of each of the test reference cell sets to read the at least a subset of the NVM block may be determined and recorded.

Once the counter 'n' equals N+1, and the error rates associated the each of the test sets have the been determined, the set of reference test cells associated with a relatively low (e.g. the lowest) read error rate may be selected (block 370).

The selected set of reference cells may either be used to operate the cell on NVM block or array (block 380), or may be used to establish an operating set of reference cells whose reference threshold voltages substantially correspond to the reference threshold voltages of the selected set (block 390), such that the established operating set may be used to operate cells in the NVM array.

The above description exemplifies one embodiment of a method of establishing a set of operating reference cells to be used in operating an NVM block of cells or array. It should be noted that other embodiments of the present invention may deviate from the above description. The selected test may be used as an operating reference set, may be used to select or program an operating set, or may be used to adjust reference levels on a set of adjustable reference structures. Furthermore, the method of the present invention may be implemented in a variety of implementations including hardware and/or software modules which may be known in the present or yet to be devised in the future. One example of a possible implementation of a method of establishing a set of operating reference cells to be used in operating cells of an NVM block or array in accordance with the some embodiments of the present invention is described herein below with reference to FIG. 4.

Figure 4:
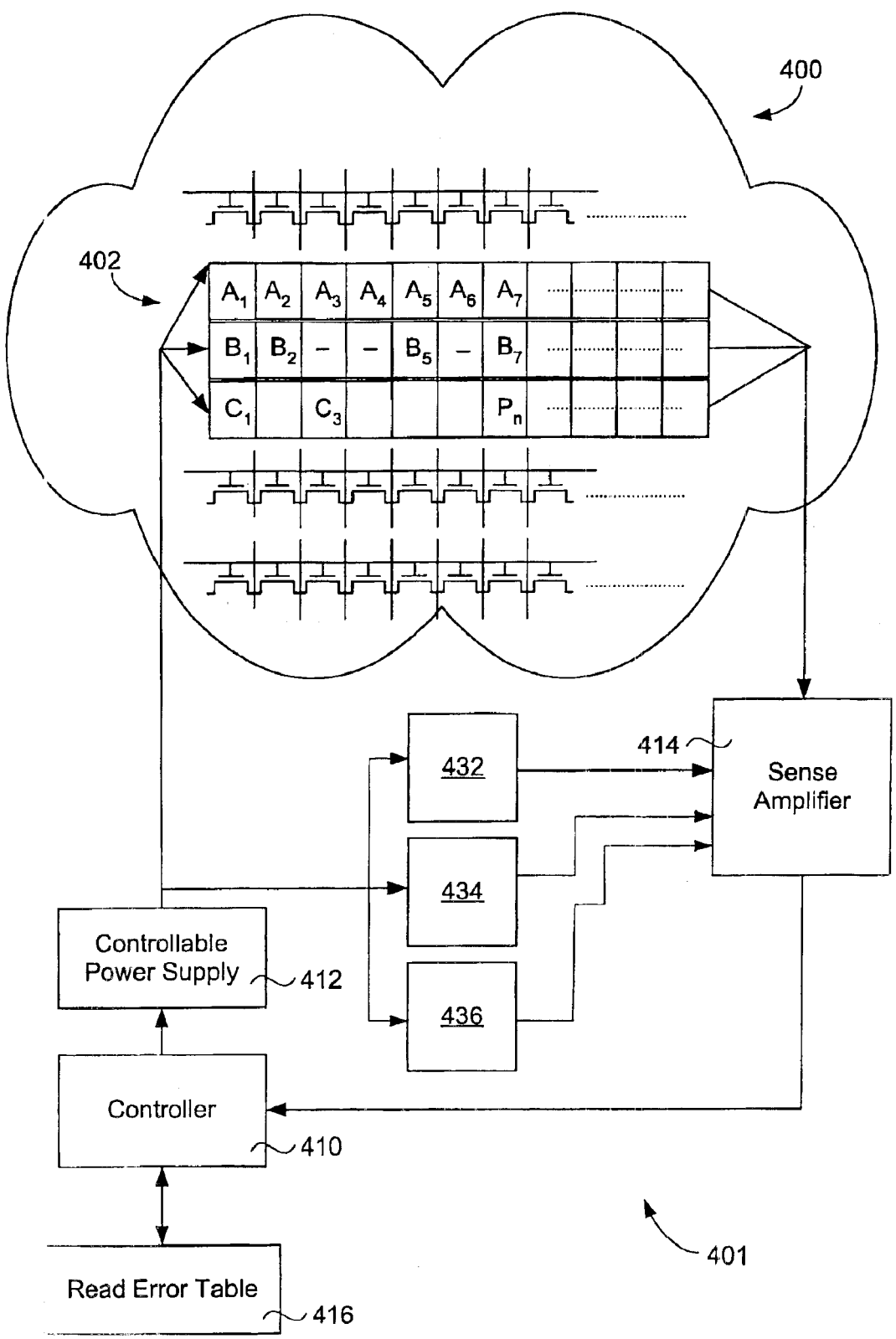
FIG. 4 is a block diagram illustration of one possible configuration of an NVM array supporting one implementation of the method of FIG. 3, according to some embodiments of the present invention.

Reference is now made to FIG. 4, which is a block diagram illustration of one possible implementation of the presentation in conjunction with an NVM array 400. As part of some embodiments of the present invention, circuitry 401 for operating the NVM block or array 400 may include a controller 410, a controllable voltage supply 412, a sense amplifier 414 and two or more sets of test reference cells 432, 434 and 436. Each set of test reference cells 432, 434 and 436 may include two or more test reference cells. Each set of test reference cells 432, 434 and 436 may have reference voltages at least slightly offset from each other set of test reference cells. For example, each set of test reference cells (e.g. 432) may be incrementally offset, such that each set may be associated with a series of threshold voltages that are slightly higher than a corresponding series of threshold voltages associated with the previous set of test reference cells (excluding the first set). As a further example, if the first set of test reference cells includes cells having reference voltages; Cell 1=4.2V, Cell 2=5.2V, Cell3=6.2V, the second set may include cells having reference voltages offset, such that; Cell 1=4.3V, Cell 2=5.3V, Cell3=6.3V, etc.

In the embodiment shown, the controller 410 may implement the counter 'n' (not shown). However, any other configuration may also be used, including, but not limited to, a distinctive counter module. The controller 410 may be configured to control the operation of the controllable voltage source 412 and of the sense amplifier 414. In accordance with some embodiments of the present invention, such as the one illustrated in FIG. 3, the controller 410 may initially set the reference test set counter 'n' to 1. Next, the controller 410 may operate the controllable voltage source 412, and use the $n^{th}$ set of test reference cells (initially the first set 432) to read at least a subset of cells 402 of the NVM block or array. As part of some embodiments of the present invention, the controller 410 may instruct the voltage source 412 to apply incrementally increasing voltage pulses to each of the memory cells in the subset area 402 and to one or more test reference cells from the $n^{th}$ set of test reference cells (e.g. 432). The threshold voltage of each of the memory cells in the subset area 402 may be compared, for example using sense amplifier 414, against the threshold voltages of one or more of the test reference cells in the $n^{th}$ set of test reference cells (e.g. 432). By comparing the threshold voltage of the cells against that of the reference cells from the $n^{th}$ set of test reference cells, the state of each of the cells in the subset of cells 402 may be read or determined. Various other techniques for comparing a memory cell's threshold voltage against those of one or more reference cells and/or structures, in order to determine the memory cell's state, are well known, and may be implemented in accordance with further embodiments of the present invention.

The controller 410 may receive the data read from the NVM cells in the subset area 402. The controller 410 may process the data, and may determine a read error rate associated with the $n^{th}$ set of test reference cells used to read the memory cells in the subset area 402. The read error rate may be determined using a variety of error rate sampling and/or error detection techniques, for example, parity bit, checksum, CRC and various other techniques. The subset area 402 and/or any of the other elements of the NVM block 400 and/or the supplementary circuitry 401, including any additional elements as may be required, may be configured to support the error rate sampling and/or error detection technique of choice. In the embodiment shown, the subset area 402 may include one or more parity bits (marked $P_n$) in support of parity check error detection. The controller 410 may be configured to process the data read from the subset area 402 and to determine a read error rate in accordance with parity check error detection. In a further embodiment of the present invention, a separate error coding and detection circuit (not shown) may be included.

Once calculated, the controller 410 may record the read error rate for each set of test reference cells or structures either internally or in a designated error rate table 416, which error rate table may be a part of the NVM block or array. The read error rate may be recorded in a manner to maintain the association of each of the recorded read error rates with the set of test reference cells that was used to generate it.

After a read error rate has been established for the $n^{th}$ set of test reference cells, the counter may be instructed to increment 'n' by 1. The controller 410 may be consulted to check whether the new value for 'n' has exceeded the total number of test reference cell sets. If so, the process of determining and recording a read error rate associated with each of the sets of test reference cells may be discontinued by the controller 410. In other words, the process of determining and recording a read error rate may be repeated for each of the N sets of test reference cells (e.g. 432, 434 and 436).

The controller 410 may then select from amongst the recorded read error rates a relatively low (e.g. the lowest) read error rate. The set of test reference cells associated with the selected relatively low read error rate may be selected as the set of operation reference cells to be used in operating cells of the NVM block or array 400. According to one optional embodiment of the present invention, the controller 410 may also determine a set of reference voltages associated with the selected test set associated with the selected relatively low read error rate. The set of reference voltages may also be recorded, for example in the error rate table 416. The set of reference voltages may be stored, such that the association of the stored set of reference voltages with the selected set of test reference cells (e.g. 432) is maintained.

According to some embodiments of the present invention, in case that the controller 410 determines that more than one of the generated read error rates, each being associated with a different set of test reference cells, is the lowest, for example, when two or more equal read error rates are equally the lowest, additional processing may be required to determine which of the sets is more likely to provide a lower read error rate. For example, the process of generating and recording a read error rate for each of the two or more sets of test reference cells may be repeated in accordance with different criteria or on an additional subset of the NVM block. Alternatively, one of the lowest read error rates may be arbitrarily selected.

As part of further embodiments of the present invention, it may be sufficient to select from amongst the sets of test reference cells (e.g. 432, 434 and 436) the set that is expected to provide a relatively low read error rate. In this case, for example, after using each of the sets of test reference cells to read at least a subset of the NVM block, as discussed above, and generating a read error rate associated with the set used, the read error rate may be checked. In case that the read error rate is below a predetermined threshold, the set of test reference cells associated with that read error rate may be selected and recorded, and the process of generating and recording a read error rate may be discontinued prior to checking all the test sets. According to yet further embodiments of the present invention, in case that none of the generated read error rates falls below the predetermined threshold, the lowest error rate may be selected in accordance with the above discussion.

In a further embodiment of the present invention, the selected set of test reference cells may be used to establish an operating set of reference cells having reference voltages substantially equal to those of the selected test set.

Figure 5:
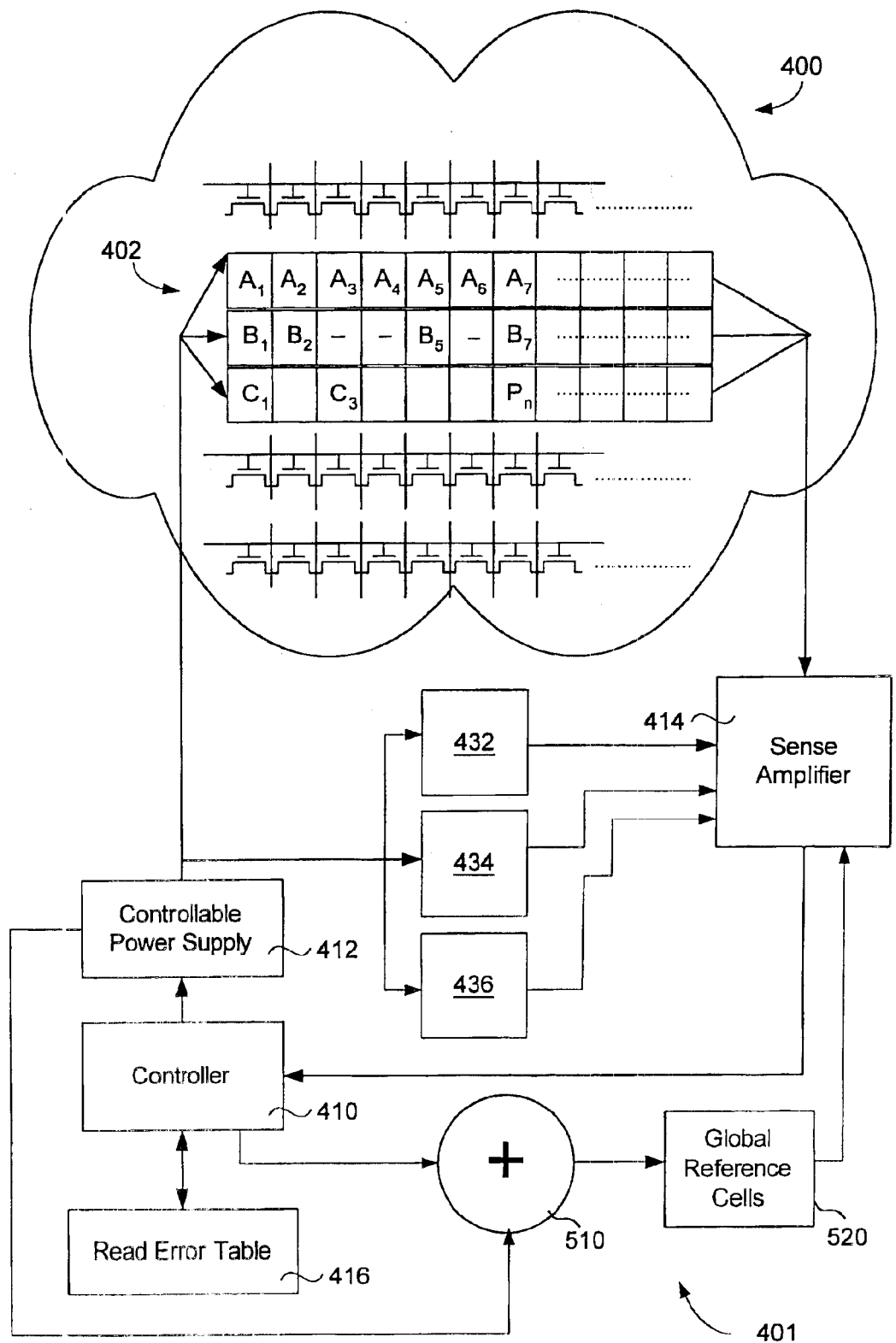
FIG. 5 is a block diagram illustration of one possible configuration of an NVM array for establishing and using a set of operating reference cells having reference voltages substantially equal to those of a selected test set.

Reference is now made to FIG. 5, which is an illustration of one possible configuration of an NVM array for establishing and using a set of operating reference cells having reference voltages substantially equal to those of a selected test set. The supplemental circuitry 401 shown in FIG. 5 may be substantially similar to that shown in FIG. 4 and may operate in a similar manner, with the addition of a set of global reference cells 520 and an offset circuit 510.

Initially, the supplemental circuitry 401 and the NVM block 400 may be operated to determine a read error rate associated with each one of the two or more sets of test reference cells 432, 434 and 436, and to select one of the two or more sets of test reference cells 432, 434 and 436 associated with a relatively low (e.g. the lowest) read error rate. Next, the selected set of test reference cells may be used to determine offset values for one or more global reference cells from the set of global reference cells 520. The offset values may be input to an offset circuit 510, either directly or via the controller 410. The offset circuit 510, either alone or in combination with a controllable voltage source 412, may be adapted to offset one or more reference voltages of global reference cells from the set of global reference cells 510. In one embodiment, the offset circuit 510 may be configured to offset the reference voltages of the global reference cells, such that the reference voltages of reference cells in the global reference set 520 may be substantially equal to corresponding reference cells in the selected test set.

In another embodiment of the present invention, a set of reference voltages associated with the selected test set may be obtained by the controller 410. As discussed above, the set of reference voltages may be recorded, for example in the error rate table 416. In this case, the set of reference voltages data may be obtained by simply retrieving the relevant data from the table 416. The controller 410 may instruct the offset circuit 510 to offset the threshold voltages of one or more of the reference cells in the set of global reference cells 520 in accordance with the set of reference voltages. In yet another embodiment of the present invention, the controller 410 may instruct the offset circuit 510 to offset the reference voltages of one or more of the global reference cells in the set of global reference cells 510, such that the threshold voltages of the set of global reference cells 510 may be substantially equal to the threshold voltages of the selected test set.

According to further embodiments of the present invention, the offset circuit 510 and the set of global reference cells 520 may be substituted with a bank of reference cells (not shown). The bank of reference cells may include two or more reference cells each reference cell in the bank being incrementally offset from the other reference cells in the bank. For example, each reference cell in the bank may have a threshold voltage that is slightly higher than the threshold voltage of the previous reference cell (excluding the first reference cell).

According to some embodiments of the present invention, once selected, the selected set of test reference cells may be used to determine which of the reference cells in the bank of reference cells is to be used for establishing an operating set of reference cells. The selected set of reference cells from the bank of reference cells may be selected such that the selected set from the bank may have reference voltages that are substantially equal to those of the selected test set. Thus, the selected set of reference cells from the bank may provide a set of operating reference cells having reference voltages substantially equal to those of the selected test set. The set of operating reference cells may be used to operate the NVM array.

While certain features of the invention have been illustrated and described herein, may modifications, substitutions, changes, and equivalents will now occur to those of ordinary skill in the art. It is, therefore, to be understood that the appended claims are intended to cover all such modifications and changes as fall within the true spirit of the invention.

I claim:

1. A method of selecting a reference level from a set of possible reference levels, comprising:

using each of said possible reference levels to read a set of cells from a memory area;

determining a read error rate for each one of said possible reference levels associated with the reading of said set of cells; and selecting a reference level from said set of possible reference levels whose read error rate is relatively low.

2. The method of claim 1, wherein said selecting comprises choosing a reference level from said set of possible reference levels resulting in the lowest read error rate.

3. The method of claim 1, wherein said selecting comprises choosing a reference level from said set of possible reference levels resulting in a read error rate that is below a predetermined threshold.

4. The method of claim 1, wherein each reference level from said set of possible reference levels is slightly different from each of the other reference voltages in said set.

5. The method of claim 4, wherein said set of possible reference levels comprises incrementally changing reference levels.

6. The method of claim 4, wherein said set of possible reference levels comprises incrementing reference levels in constant increments.

7. The method of claim 4, wherein said set of possible reference levels comprises incrementally changing reference levels in changing increments.

8. The method of claim 1, further comprising repeating each of said using, determining and selecting for each verify level of said memory states.

9. The method of claim 6, further comprising using a different set of possible reference levels for each state of said memory area.

10. The method of claim 6, further comprising using a different set of possible reference levels for each state of said memory area simultaneously.

11. The method of claim 1, further comprising repeating each of said using, determining and selecting for each charge storage region of one or more memory cells.

12. The method of claim 8, wherein said repeating comprises repeating each of said using, determining and selecting for each charge storage region of one or more NROM memory cells.

13. A method of establishing a reference cell based on a selected reference voltage, comprising:

determining a read error rate associated with each possible reference voltage from a set of possible reference voltages;

selecting a reference voltage from said set of possible reference voltages resulting in a relatively low read error rate; and establishing a reference cell based on said selected reference voltage.

14. The method of claim 13, wherein said establishing comprises:

comparing said selected reference voltage to each of a plurality of reference cells from a bank of reference cells; and selecting a reference cell from said bank of reference cells having a relatively low read error rate.

15. The method of claim 14, wherein said selecting comprises choosing a reference cell from said bank of reference cells having the lowest read error rate.

16. The method of claim 14, wherein said error rate is representative of the correlation between said reference voltage and the threshold voltage of each of said reference cells.

17. The method of claim 16, wherein each of said reference cells is configured to have a slightly different threshold voltage.

18. The method of claim 17, wherein the threshold voltage of each of said reference cells is incrementally changing.

19. The method of claim 14, wherein said determining, said selecting and said establishing may be repeated for each state of a Multi Level Cell.

20. The method of claim 13, wherein said determining, said selecting and said establishing may be perform simultaneously for each state of a Multi Level Cell.

21. The method of claim 19, wherein for each repeat of said determining, said selecting and said establishing a distinct set of reference voltages is used.

22. The method of claim 13, wherein said establishing comprises adapting an offset circuit such that said set of possible reference voltages in combination with an offset value may be substantially equal to said selected reference voltage. [no support in the spec. for effective gate voltage; paragraph 37 provides support for the amended claim]

23. The method of claim 22, wherein said adapting comprises:

receiving an input signal to be associated with said selected reference voltage;

processing said input signal to determine an offset value associated with said selected reference voltage; and offsetting a voltage to be applied to the reference cell in accordance with said offset value.

24. The method of claim 23, wherein said processing comprises calculating said offset value to indicate to said offset circuit to offset an input voltage by said offset value, such that said set of possible reference voltages to be applied to said reference cell is substantially equal to the reference voltage of said reference cell.

25. The method of claim 24, wherein said offsetting comprises offsetting an input that is substantially equal to said selected reference voltage, such that said set of possible reference voltages is substantially equal to the threshold voltage of said reference cell.

26. The method of claim 13, wherein said establishing comprises programming said reference cell such that the threshold voltage of the reference cell is substantially equal to said selected reference voltage.

27. The method of claim 26, wherein said programming comprises programming said selected reference voltage into said reference cell.

28. The method of claim 27, wherein said programming comprises programming one of a set of preselected programming values into said reference cell.

29. A method of operating a memory array based on a selected reference voltage, comprising:

determining a read error rate associated with one or more possible reference voltages from a set of possible reference voltages;

selecting a reference voltage from said set of possible reference voltages resulting in a relatively low error rate;

establishing a reference cell based on said selected reference voltage; and operating said memory array using said established reference cell.

30. The method of claim 29, wherein said operating comprises reading at least one memory cell from said memory array using said established memory cell.

31. The method of claim 29, wherein selecting a reference voltage from the set of possible reference voltages is done prior to determining a read error rate for all of the possible sets of reference voltages.

32. The method according to claim 31, wherein a first reference voltage associated with an error rate below a predefined threshold value is selected.

33. The method according to claim 29, wherein the cell operated is selected from the group consisting of non-volatile memory ("NVM") cells, and NVM Multi-Level Cell ("MLC").

34. The method according to claim 29, further comprising storing a plurality of error detection rates in close proximity to the memory cells.

35. The method according to claim 29, further comprising storing a plurality of selected reference values in close proximity to the memory cells.

* * * * *

UNITED STATES PATENT AND TRADEMARK OFFICE
CERTIFICATE OF CORRECTION

PATENT NO. : 6,963,505 B2  Page 1 of 1
DATED : November 8, 2005
INVENTOR(S) : Cohen, Guy It is certified that error appears in the above-identified patent and that said Letters Patent is hereby corrected as shown below:

Title page,
Item [73], Assignee, should read -- SAIFUN SEMICONDUCTORS LTD., Nentanya, (IL) --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO.        : 6,963,505 B2
APPLICATION NO.   : 10/695448
DATED             : November 8, 2005
INVENTOR(S)       : Cohen, Guy It is certified that error appears in the above-identified patent and that said Letters Patent is hereby corrected as shown below:

On The Title Page:
Item [73], under "Assignee": The applicant's city should read: Netanya, IL

Signed and Sealed this

Twenty-second Day of August, 2006

JON W. DUDAS
*Director of the United States Patent and Trademark Office*